(12) United States Patent
Cheng et al.

(10) Patent No.: US 7,642,793 B2
(45) Date of Patent: Jan. 5, 2010

(54) ULTRA-FINE PITCH PROBE CARD STRUCTURE

(75) Inventors: Hsu Ming Cheng, Hsin-Chu (TW); Frank Hwang, Hsinchu (TW); Clinton Chao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 11/768,087

(22) Filed: Jun. 25, 2007

(65) Prior Publication Data

US 2008/0116923 A1 May 22, 2008

Related U.S. Application Data

(60) Provisional application No. 60/860,559, filed on Nov. 22, 2006.

(51) Int. Cl.
*G01R 31/02* (2006.01)

(52) U.S. Cl. .................. 324/754; 324/761; 439/482

(58) Field of Classification Search ......... 324/754–765; 439/482
See application file for complete search history.

(56) References Cited

U.S. PATENT DOCUMENTS

| | | | |
|---|---|---|---|
| 5,177,439 A * | 1/1993 | Liu et al. .................. 324/754 |
| 5,476,211 A | 12/1995 | Khandros | |
| 5,974,662 A | 11/1999 | Eldridge et al. | |
| 6,238,938 B1 * | 5/2001 | Smith ....................... 438/10 |
| 6,292,003 B1 | 9/2001 | Fredrickson et al. | |
| 6,328,938 B1 * | 12/2001 | Taylor et al. ................ 423/79 |
| 6,586,955 B2 * | 7/2003 | Fjelstad et al. .............. 324/754 |
| 6,661,244 B2 | 12/2003 | McQuade et al. | |
| 6,676,438 B2 * | 1/2004 | Zhou et al. .................. 439/482 |
| 6,815,961 B2 | 11/2004 | Mok et al. | |
| 6,906,540 B2 | 6/2005 | McQuade et al. | |
| 6,917,102 B2 * | 7/2005 | Zhou et al. .................. 257/698 |
| 7,049,837 B2 * | 5/2006 | Kasukabe et al. ........... 324/754 |
| 7,129,730 B2 * | 10/2006 | Liu et al. ..................... 324/758 |
| 7,145,354 B2 * | 12/2006 | Stillman ..................... 324/754 |
| 2003/0057976 A1 | 3/2003 | Deguchi | |
| 2006/0033515 A1 * | 2/2006 | Haba .......................... 324/754 |
| 2006/0125498 A1 * | 6/2006 | Liu et al. ..................... 324/754 |
| 2007/0152689 A1 * | 7/2007 | Lee et al. ..................... 324/761 |
| 2007/0222465 A1 * | 9/2007 | Huang et al. ................ 324/754 |
| 2008/0048685 A1 | 2/2008 | Chui et al. | |

* cited by examiner

*Primary Examiner*—Ha Tran T Nguyen
*Assistant Examiner*—Arleen M Vazquez
(74) *Attorney, Agent, or Firm*—Slater & Matsil, L.L.P.

(57) ABSTRACT

A system and a method of testing a semiconductor die is provided. An embodiment comprises a plurality of metal tips that are connected to a redistribution layer that fans out the pitch from the tips to metal plugs located in the substrate. The metal tips could be formed using semiconductor processes and either adding smaller layers of metal to larger layers of metal or else removing portions of one piece of metal to form the tips. The metal plugs are connected to a space transformation layer. The space transformation layer is electrically connected to a printed circuit board using, for example, a spring loaded connection such as a pogo pin. The space transformation layer is aligned onto the printed circuit board by a series of guidance mechanisms such as smooth fixtures, and the planarity of the tips is adjusted by adjusting a series of screws.

20 Claims, 17 Drawing Sheets

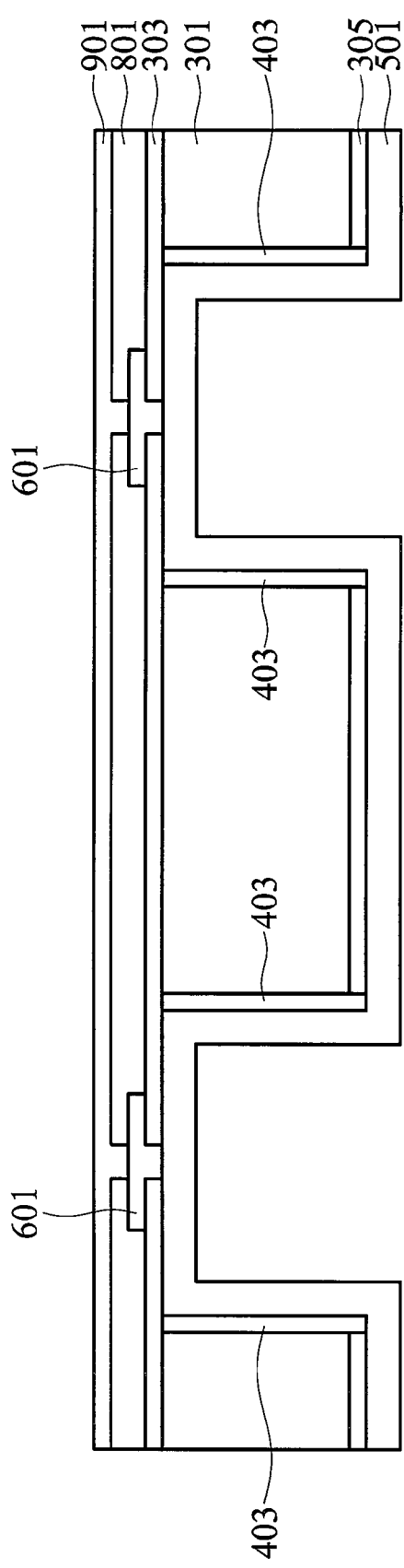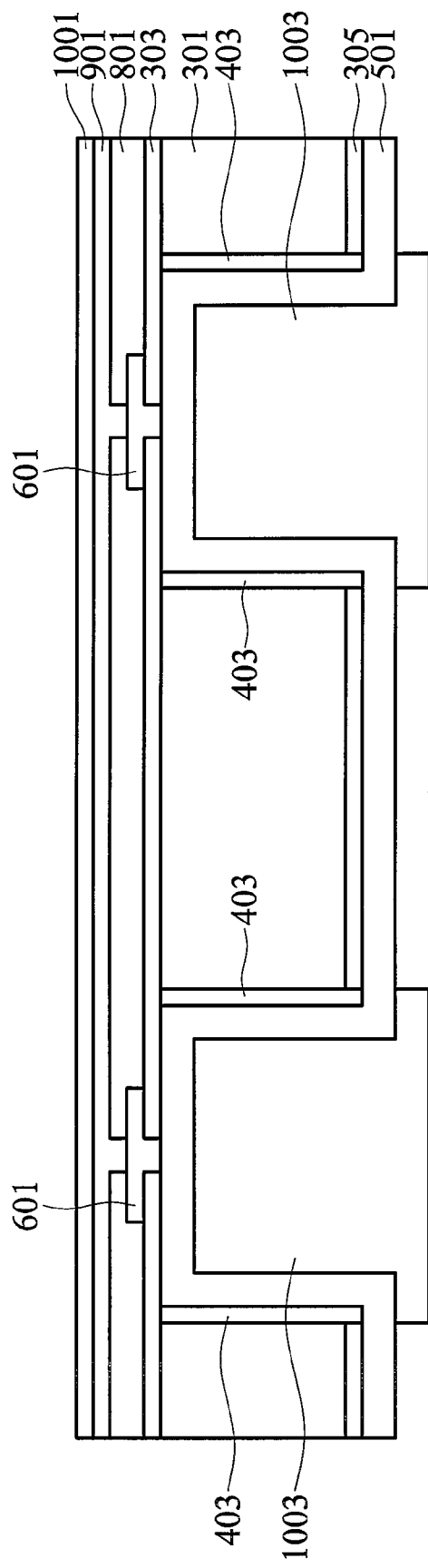

ULTRA-FINE PITCH PROBE CARD STRUCTURE

This application claims the benefit of U.S. Provisional Application No. 60/860,559, filed on Nov. 22, 2006, entitled TSV MEMS Probe Card for Ultra-Fine Pitch Probing, which application is hereby incorporated herein by reference.

TECHNICAL FIELD

The present invention relates generally to a system for testing semiconductor devices and, more particularly, to a system and method for forming a probe card with an ultra-fine pitch.

BACKGROUND

In the manufacturing of integrated circuits and other semiconductor devices, the circuits and devices must be tested in order to ensure that a functional device has been manufactured. These tests are usually performed by contacting a test probe card to the relevant areas of the semiconductor device, and performing one or more functional tests. Two main types of probe cards are currently used to make these connections.

FIG. 1 illustrates a plan view of one type of probe card 100 that is used to test a semiconductor device (not shown). This probe card uses a series of cantilever connectors 101 that radiate inward from the edges of the probe card 100. When the probe card 100 is lowered onto the semiconductor device to be tested, the cantilevered connectors 101 connect to corresponding contact pads on the semiconductor device to complete the electrical connections for the test. Unfortunately, this type of probe card 100 is limited due to the fact that the contact pads are limited to the peripheral of the semiconductor device to be tested, and it cannot reach contact pads located in the central areas of the devices.

FIG. 2 illustrates a cross section of a portion of another type of probe card 200 that uses an array of electrical connections 201 in order to connect to a semiconductor device (not shown) in areas other than the periphery. In this type of probe card 200, the electrical connections 201 are spaced closely together in an array, and are shaped so that the electrical connections 201 absorb some of the shock of the impact when the probe card 200 is lowered onto the semiconductor device to be tested. However, the minimum pitch (the distance between the electrical connections 201) for this type of card is limited by the structure and shape of the electrical connections 201 and the current finest pitch attainable with this type of probe card is about 175 μm.

Unfortunately, as the dimensions of semiconductor devices are reduced in the ever-present drive for smaller and smaller devices, these types of probe cards will be unable to adequately test semiconductor devices requiring a smaller probe pitch. Accordingly, a probe card with a smaller probe pitch is needed.

SUMMARY OF THE INVENTION

These and other problems are generally solved or circumvented, and technical advantages are generally achieved, by embodiments of the present invention that include a semiconductor device test structure. An advantage of embodiments of the present invention is that a smaller contact pitch can be obtained. This allows for the testing of smaller structures.

In accordance with an embodiment of the present invention, a device for testing semiconductor devices comprises a substrate with a plurality of metal plugs extending through the substrate and having a first pitch. The plugs are connected on one side of the substrate to electrical connectors and connected on the other side of the substrate to respective sections of a metal layer. A plurality of tips is also connected to respective sections of the metal layer. The plurality of tips has a second pitch that is different from the first pitch, and further comprises an upper portion that is smaller than a lower portion.

In accordance with another embodiment of the present invention, a device for testing semiconductor devices comprises an array of tips, each tip having an upper portion and a lower portion, the upper portion having a smaller dimension than the lower portion. The tips are connected to a redistribution line that fans out the pitch of the tip and has an upper portion and a lower portion, the upper portion comprising a different metal than the lower portion. The redistribution line is connected to another metal line, which is connected to metal plugs that go through a substrate. The metal plugs connect the tips to a space transformation layer that fans the pitch out even further. Finally, the space transformation layer is connected a printed circuit board.

In accordance with yet another embodiment of the present invention, a device for testing semiconductor devices comprises a printed circuit board electrically connected to a space transformation layer. The space transformation layer reduces the pitch of the contacts, and is connected to a substrate through connectors. The substrate has metal plugs that extend through it and are connected to the connectors. The metal plugs are also connected to a first metal layer, which is connected to a second metal layer, which is used to reduce the pitch of the connections even further. A third metal layer overlies the second metal layer, and a plurality of tips is located connected to the third metal layer. In other words, there is a multi-layer process for the signal line to meet the fine pad pitch. The tips have an upper portion and a lower portion, and the upper portion has smaller dimensions than the lower portion.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3-21 illustrate steps in the formation of an embodiment of the present invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a probe card. The invention may also be applied, however, to other non-permanent electrical connections.

Figure 2:
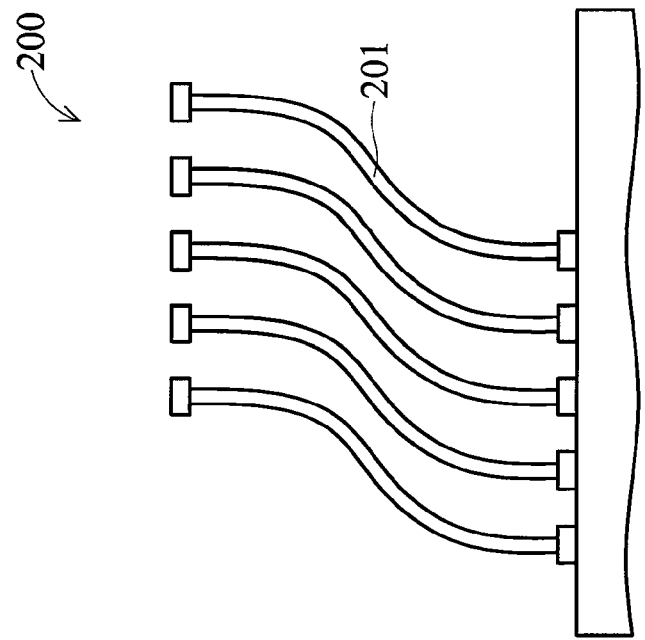
FIG. 2 illustrates a portion of an array type probe card in the prior art.
Figure 1:
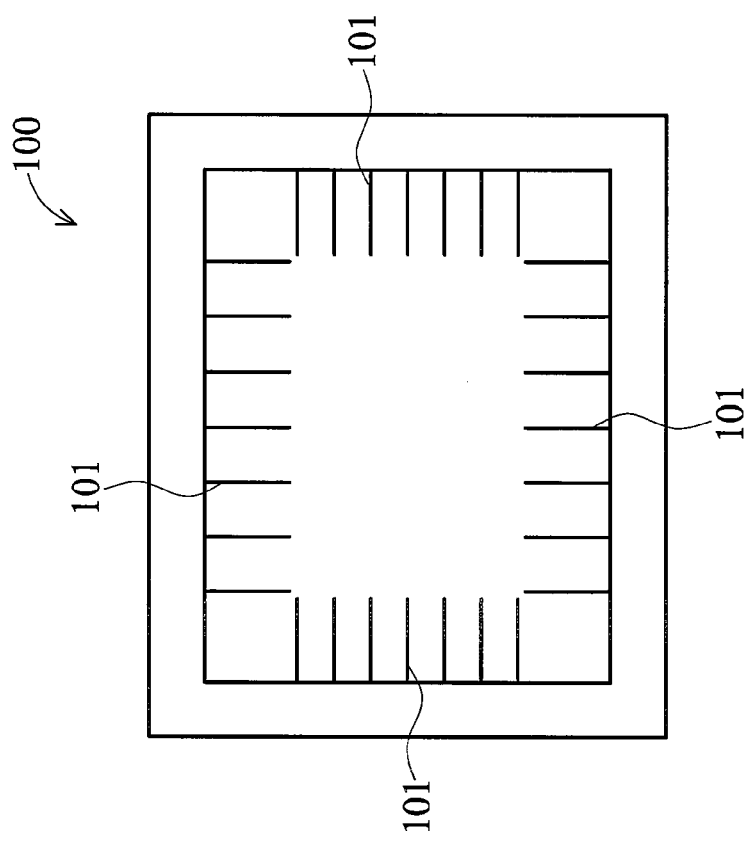
FIG. 1 illustrates a cantilever pitch card in the prior art.
Figure 3:
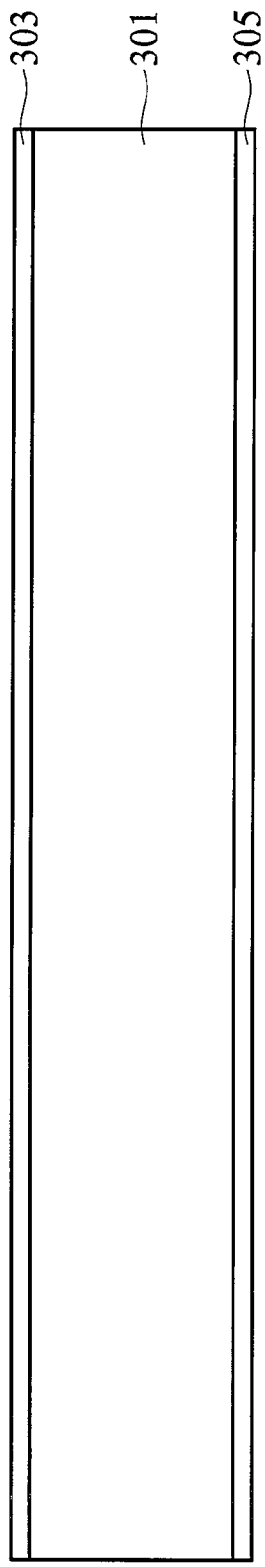

With reference now to FIG. 3, there is shown a substrate 301 with a first dielectric layer 303 and a second dielectric layer 305 located on opposing sides of the substrate 301. The substrate 301 comprises a semiconductor material such as silicon, germanium, silicon germanium, or combinations thereof, and is preferably an n-type semiconductor material. The substrate 301 is initially between about 50 µm to about 800 µm, with a preferred thickness of about 500 µm.

The first dielectric layer 303 and the second dielectric layer 305 are preferably located on opposing sides of the substrate 301, and preferably comprise thermal oxide. The first dielectric layer 303 and second dielectric layer 305 are preferably formed by any oxidation process, such as wet or dry thermal oxidation in an ambient comprising an oxide, $H_2O$, NO, a combination thereof, or the like. The first dielectric layer 303 and the second dielectric layer 305 preferably have a thickness between about 0.5 µm and about 3 µm, with a preferred thickness of about 2 µm.

Figure 4:
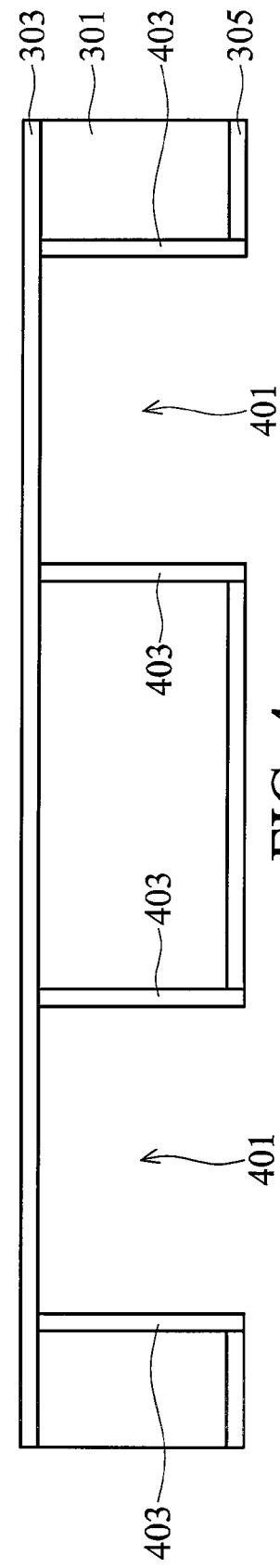

FIG. 4 illustrates the formation of first openings 401 through the second dielectric layer 305 and the substrate 301. In forming the first openings 401 portions of the second dielectric layer 305 are removed by forming and patterning a photoresist layer, and then etching the second dielectric layer 305 to remove the undesired portions.

The portions of the second dielectric layer 305 may be removed using a conventional etchant such as hexaflouropropene ($C_2HF_3$) or a perflourocarbon such as perfluoroeneopentane ($C_5F_{12}$). However, as one skilled in the art will recognize, many other etchants and processes, such as $C_xF_y$ or $C_xF_yH_z$, could alternatively be utilized in order to remove the undesired portions of the second dielectric layer 305. The examples described above are merely meant to be an illustrative, and not an exclusive listing of potential etchants.

Once the undesired portions of the second dielectric layer 305 have been removed, the first openings 401 may be formed in the substrate 301. The first openings 401 preferably extend substantially all of the way to the first dielectric layer 303, thereby substantially exposing portions of the first dielectric layer 303. The first openings 401 are preferably formed using Inductively Coupled Plasma (ICP) to remove the exposed substrate 301. However, other processes and materials could alternatively be used to form the first openings 401 in the substrate 301.

Once the first openings 401 have been formed in the substrate 301, a third dielectric layer 403 is preferably formed on the sidewalls of the first openings 401 to cover the now exposed substrate 301. The third dielectric layer 403 may have similar dimensions and may be formed in a similar fashion as described above with reference to the first dielectric layer 303 and the second dielectric layer 305.

Figure 5:
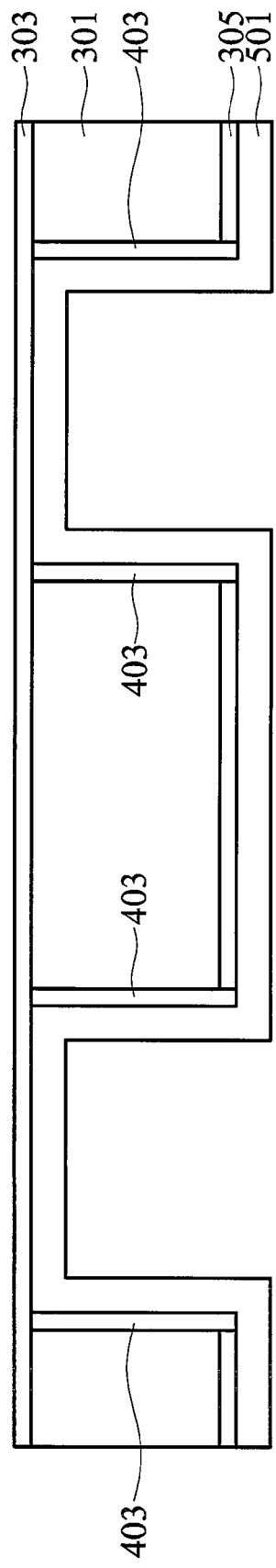

FIG. 5 illustrates the formation of a first metal layer 501 in the first openings 401 and over the second dielectric layer 305. The first metal layer 501 preferably comprises copper, and is formed through a suitable formation process such as electrochemical copper plating (ECP). However, other materials, such as aluminum, nickel, or tungsten, and other suitable methods of formation could alternatively be used. The first metal layer 501 preferably has a thickness of between about 1 µm and about 500 µm, with a preferred thickness of about 20 µm.

Figure 6:
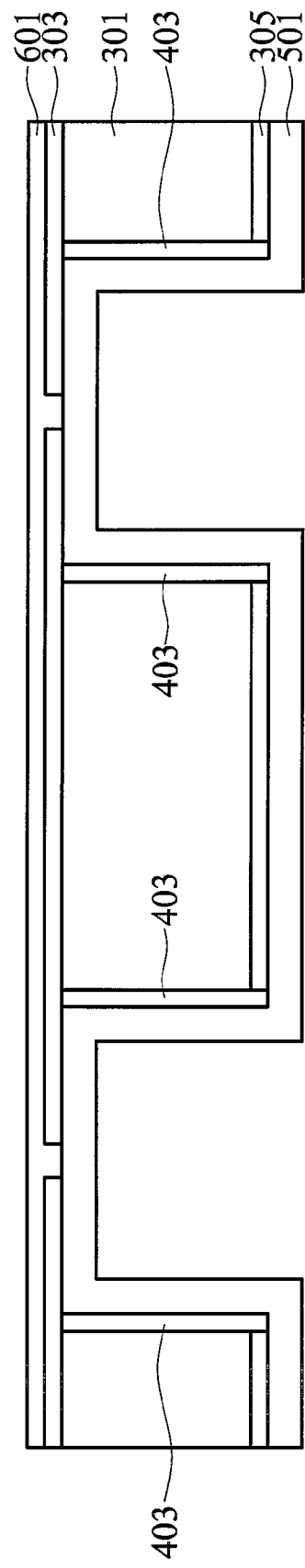

FIG. 6 illustrates the formation of a second metal layer 601 over the first dielectric layer 303 and the connection of the second metal layer 601 to the first metal layer 501. Prior to the formation of the second metal layer 601, portions of the first dielectric layer 303 are removed so as to substantially expose a portion of the first metal layer 501. The removal of these portions of the first dielectric layer 303 is preferably performed by forming and patterning a photoresist layer (not shown), and then etching exposed portions of the first dielectric layer 303, using a process such as reactive ion etching. The etching may be performed in a similar fashion as the removal of portions of the second dielectric layer 305 as described above with reference to FIG. 4.

Once portions of the first metal layer 501 have been exposed, the second metal layer 601 is preferably formed to fill the hole left by the removal of portions of the first dielectric layer 303 to form an electrical connection between the first metal layer 501 and the second metal layer 601. The second metal layer 601 preferably comprises copper, and may be formed through a process such as sputter deposition or electrochemical plating, although other suitable materials and methods of formation may alternatively be used. The second metal layer 601 is preferably formed to have a thickness of between about 1 µm and about 30 µm, with a preferred thickness of about 5 µm.

Figure 7:
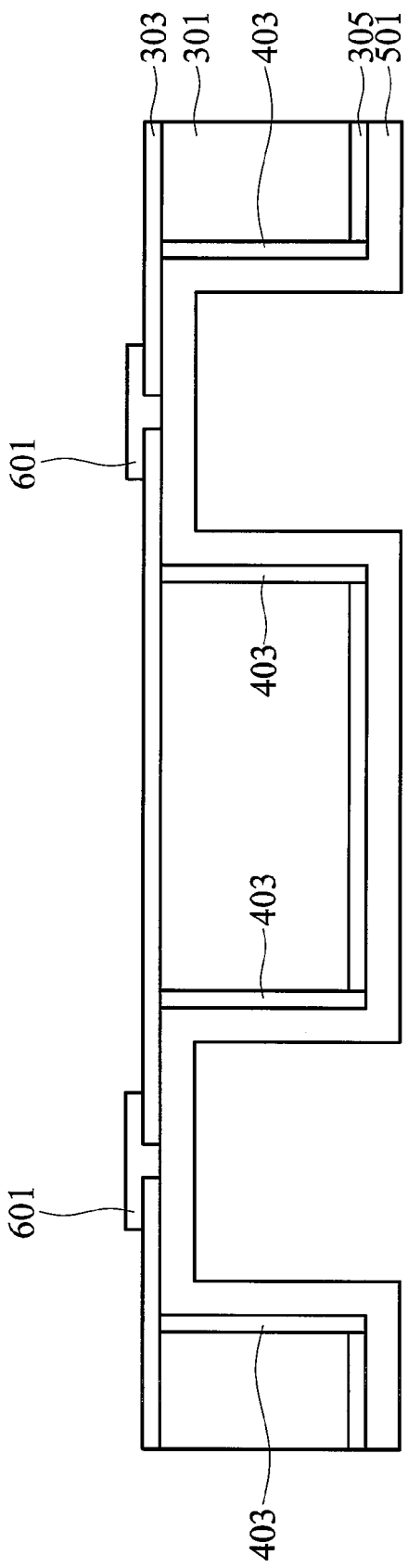

FIG. 7 illustrates the patterning of the second metal layer 601. The second metal layer 601 may be formed by placing and patterning a photoresist layer (not shown) over the second metal layer 601, and wet etching the exposed portions of the second metal layer 601 to shape the second metal layer 601 into interconnects.

Each portion of the second metal layer 601 is preferably connected to a respective first opening 401. The second metal layer 601 preferably has a thickness of between 1 um and about 30 um, with a preferred thickness of about 5 µm. Further, an upper portion of the second metal layer 601 connected to the first metal layer 501 should cover and expand beyond the lower portion of the second metal layer 601 that is located in the opening through the first dielectric layer 303.

Figure 8:
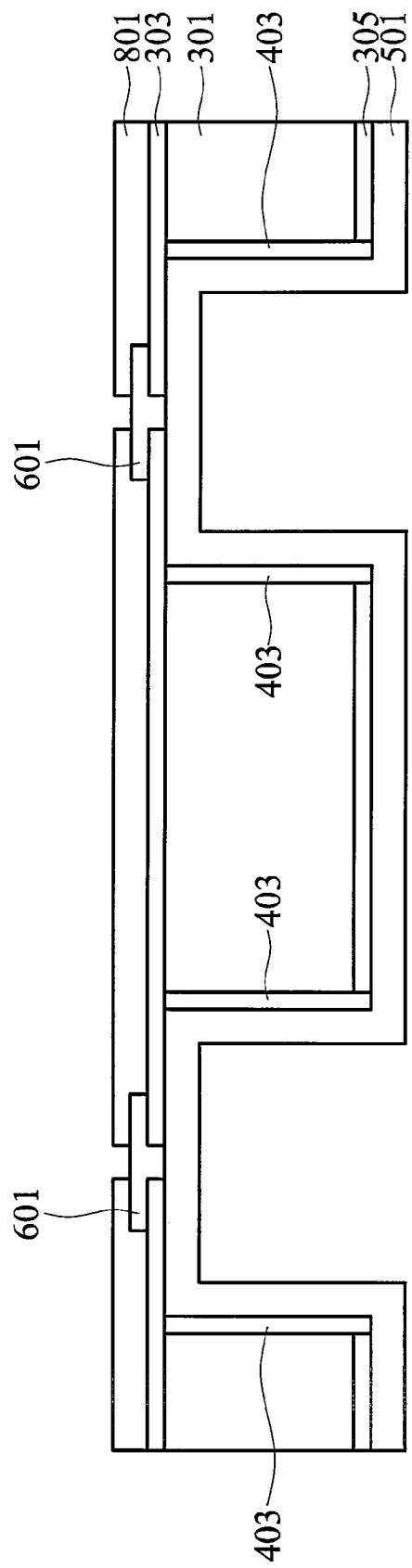

FIG. 8 illustrates the formation and patterning of a third dielectric layer 801 over the second metal layer 601. The third dielectric layer 801 may comprise dielectric material such as silicon oxide, silicon oxynitride, silicon nitride, an oxide, a nitrogen-containing oxide, a combination thereof, or the like, and preferably comprises a nitride, although other suitable materials could used. The third dielectric layer 801 may be formed through chemical vapor deposition, although other processes could alternatively be used. The third dielectric layer 801 preferably has a thickness of between about 0.5 um and about 3 um, with a preferred thickness of about 1 µm.

After the formation of the third dielectric layer 801, the third dielectric layer 801 is preferably patterned by removing portions of the third dielectric layer 801 and substantially revealing openings to the second metal layer 601. Portions of the third dielectric layer 801 may be removed in a similar fashion as portions of the first dielectric layer 303 described above with reference to FIG. 6. However, other suitable methods could alternatively be used to pattern the third dielectric layer 801.

FIG. 9 illustrates the formation of a third metal layer 901 over the third dielectric layer 801. The third metal layer 901 preferably comprises copper, and may be formed through a process such as sputter deposition. The third metal layer 901 is preferably formed to make electrical contact with the second metal layer 601 through the patterned third dielectric layer 801. However, other materials, such as tungsten and aluminum, and other methods of formation, such as CVD, could alternatively be used to form the third metal layer 901. The third metal layer 901 preferably is formed to have a thickness of between about 0.5 um and about 3 um, with a preferred thickness of about 1 µm.

FIG. 10 illustrates the formation of a first photoresist layer 1001 over the third metal layer 901 and a second photoresist layer 1003. The first photoresist layer 1001 is preferably formed over the third metal layer 901 to protect it from subsequent processing steps. The second photoresist layer 1003 is preferably formed over the first metal layer 501 on the opposite side of the substrate 301 from the first photoresist layer 1001. The second photoresist layer 1003 is then preferably patterned to substantially expose those portions of the first metal layer 501 that are not located in the first openings 401.

Figure 11:
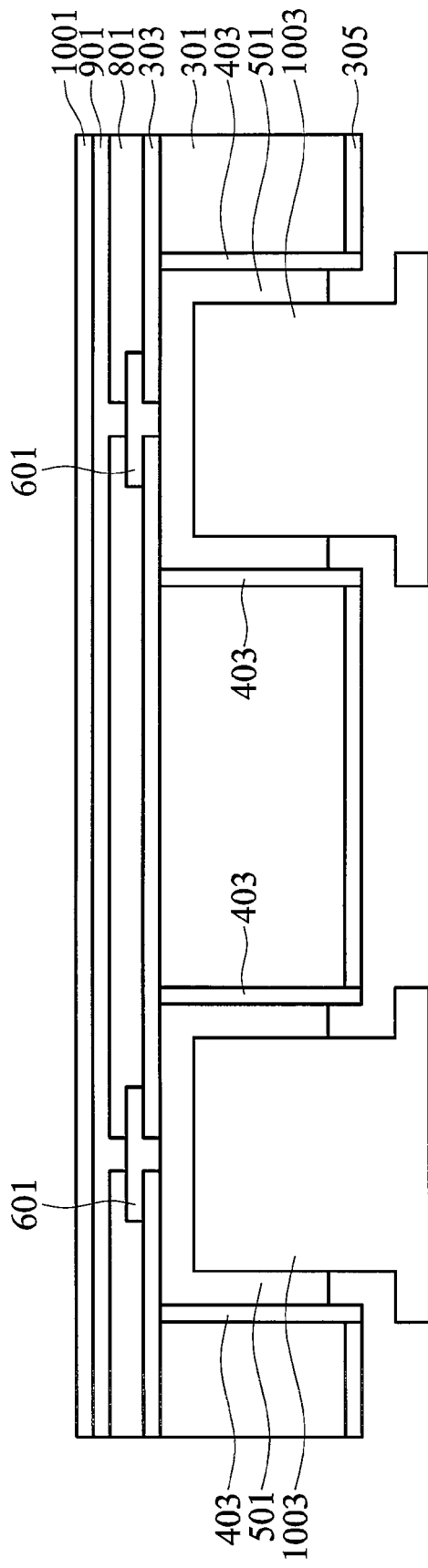

FIG. 11 illustrates the resultant structure after the first metal layer 501 has been etched to remove the exposed portions of the first metal layer 501. In an embodiment in which the first metal layer 501 is copper, the first metal layer 501 may be etched with any suitable etchant, such as ASP100 (a solution of approximately 15-20% $(NH_4)_2S_2O_8+H_2O$). The etching preferably substantially removes the first metal layer 501 from the outside second dielectric layer 305 outside of the first openings 401, and the etching is also continued to overetch the remaining portions of the first metal layer 501, such that the remaining portions of the first metal layer 501 are not substantially planar with the second dielectric layer 305.

Figure 12:
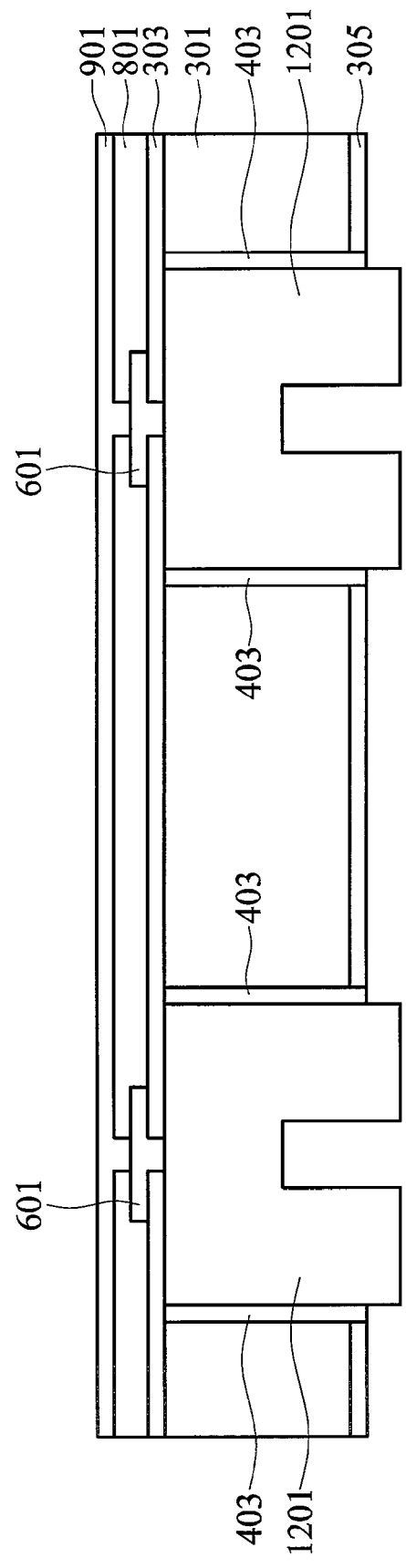

FIG. 12 illustrates the removal of the first photoresist layer 1001 and the second photoresist layer 1003, and the formation of metal plugs 1201 in the first openings 401. In an embodiment in which the first metal layer 501 is copper, once the first photoresist layer 1001 and the second photoresist layer 1003 have been removed, the metal plugs 1201 may be formed by, for example, an electroplating process using the first metal layer 501 as a seed layer. However, other materials and processes may alternatively be used to form the metal plugs 1201. The metal plugs preferably have a thickness of between about 5 um and about 300 um, with a preferred thickness of about 20 µm, and a pitch of about 250 µm.

Figure 13:
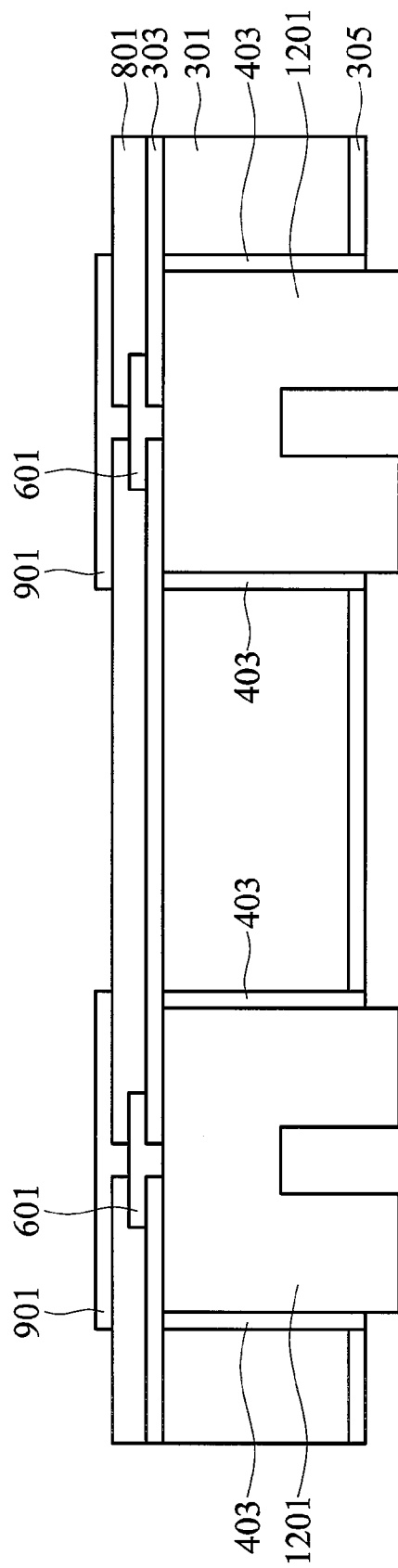

FIG. 13 illustrates the resulting structure after the third metal layer 901 has been patterned. This patterning may be performed in a similar fashion as the patterning of the second metal layer 601, as described above with reference to FIG. 7. The third metal layer 901 is preferably used as a redistribution layer in order to change the pitch between the metal plugs 1201 and contact tips (described below with reference to FIGS. 18a-b and FIGS. 19a-c).

Figure 14:
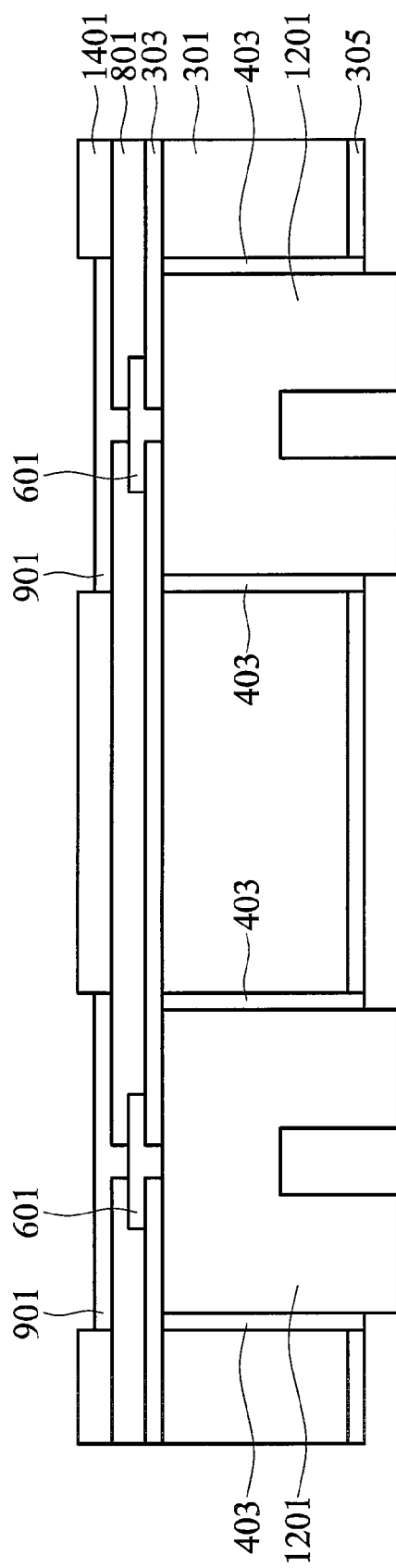

FIG. 14 illustrates the formation and patterning of a fourth dielectric layer 1401 over the third metal layer 901. The fourth dielectric layer 1401 is formed in a similar fashion and of similar materials as the third dielectric layer 801. However, once the fourth dielectric layer 1401 has been formed, the fourth dielectric layer 1401 is preferably patterned (by a similar process used to pattern the third dielectric layer 801) in order to substantially expose at least a portion of the third metal layer 901.

Figure 15:
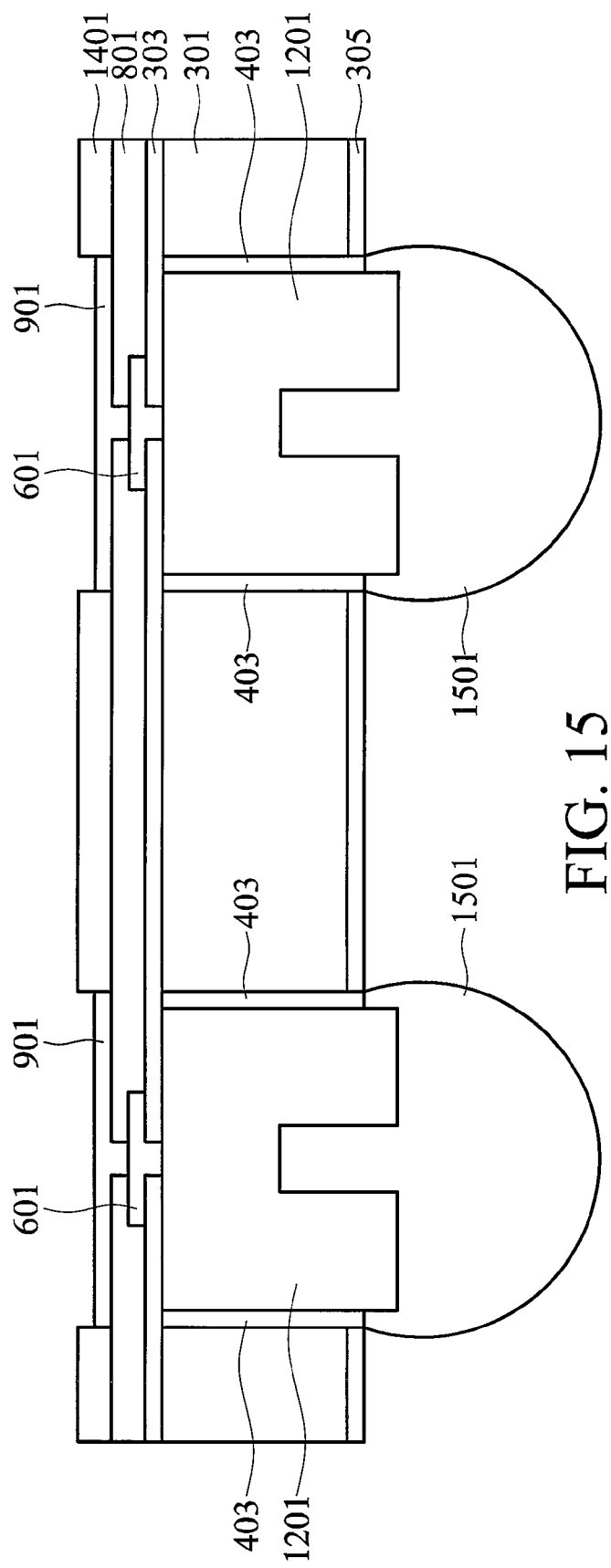

FIG. 15 illustrates the formation of first connectors 1501 on the metal plugs 1201 which will be used to connect the finished tips (described below with respect to FIG. 18a-b and FIGS. 19a-c) with the remainder of the test structure. In an embodiment, these first connectors 1501 may be solder bumps, which may comprise a material such as tin, or other suitable materials, such as silver or copper. In an embodiment in which the first connectors 1501 are tin solder bumps, the first connectors 1501 may be formed by initially forming a layer of tin through such commonly used methods such as evaporation, electroplating, printing, solder transfer, ball placement, etc, to a preferred thickness of about 100 µm.

Once a layer of tin has been formed on the structure, a reflow is preferably performed in order to shape the material into the desired bump shape.

Figure 16:
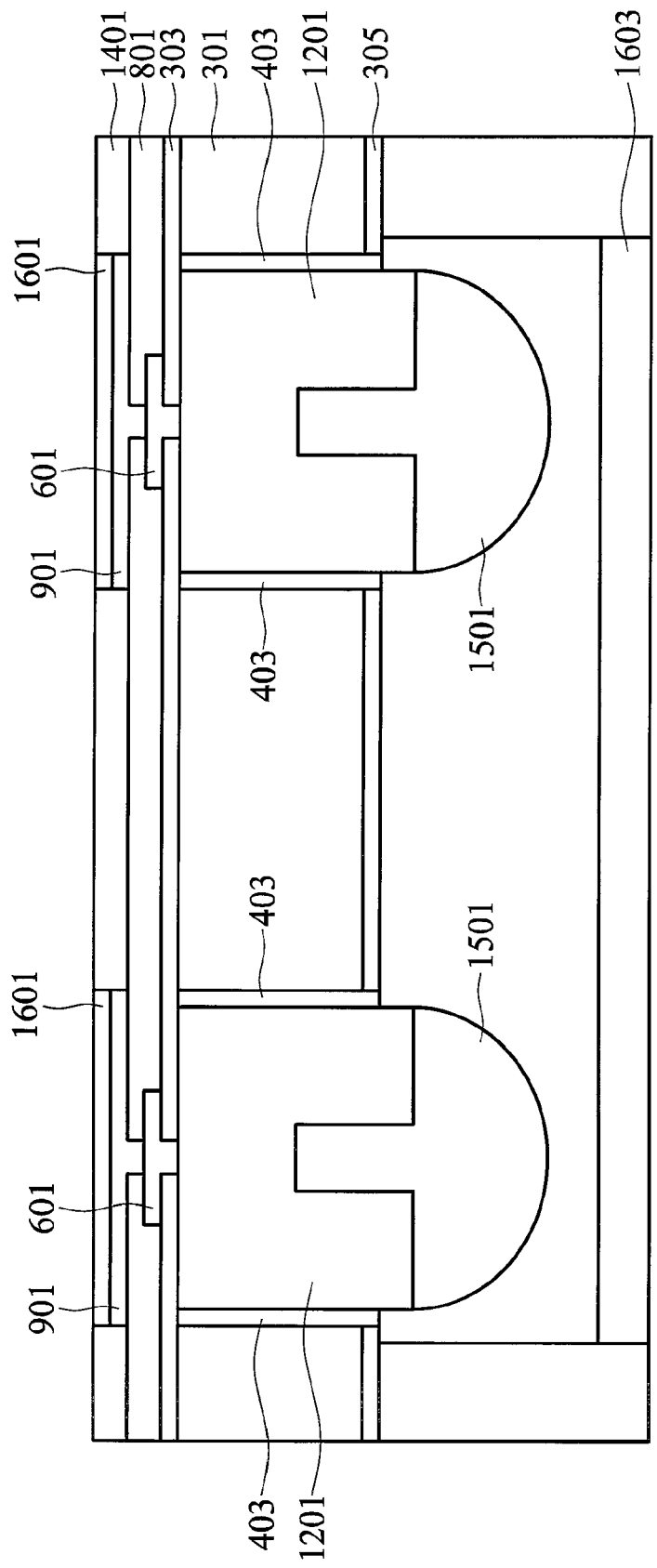

FIG. 16 illustrates the formation of a fourth metal layer 1601 that is plated to the exposed surface of the third metal layer 901. Prior to the formation of the fourth metal layer 1601, a protective wafer, preferably comprising a glass compound, is placed over the first connectors 1501 as a protective cover. Once the first connectors 1501 have been protected, the fourth metal layer 1601 is formed for example, through a process such as sputter deposition, although other processes of formation could alternatively be used. The fourth metal layer 1601 preferably comprises gold, but other metals such as nickel, copper, or tungsten, could alternatively be used. The fourth metal layer 1601 preferably has a thickness of between about 0.1 m and about 10 µm, with a preferred thickness of about 0.5 µm.

Once the fourth metal layer 1601 has been formed in contact with the third metal layer 901 in the holes of the fourth dielectric layer 1401, the material of the fourth metal layer 1601 outside of the opening within the fourth dielectric layer 1401 is preferably removed. The undesired portions of the fourth metal layer 1601 may be removed by initially forming a photoresist layer (not shown) over the fourth metal layer 1601. After the photoresist layer has been patterned, the exposed portions of the fourth metal layer 1601 are preferably etched to remove the undesired material, leaving only the material in the openings connected to the second metal connections 1401.

As one of ordinary skill in the art will realize, the formation of three different metal layers (the second metal layer 601, the third metal layer 901, and the fourth metal layer 1601) to form the electrical connection to the metal plugs 1201 is merely illustrative of a particular embodiment of the present invention, and is not meant to limit the present invention in any way. Any number of metal layers may be used to form the electrical connection to the metal plugs 1201, and these are all included within the scope of the present invention.

Figure 17:
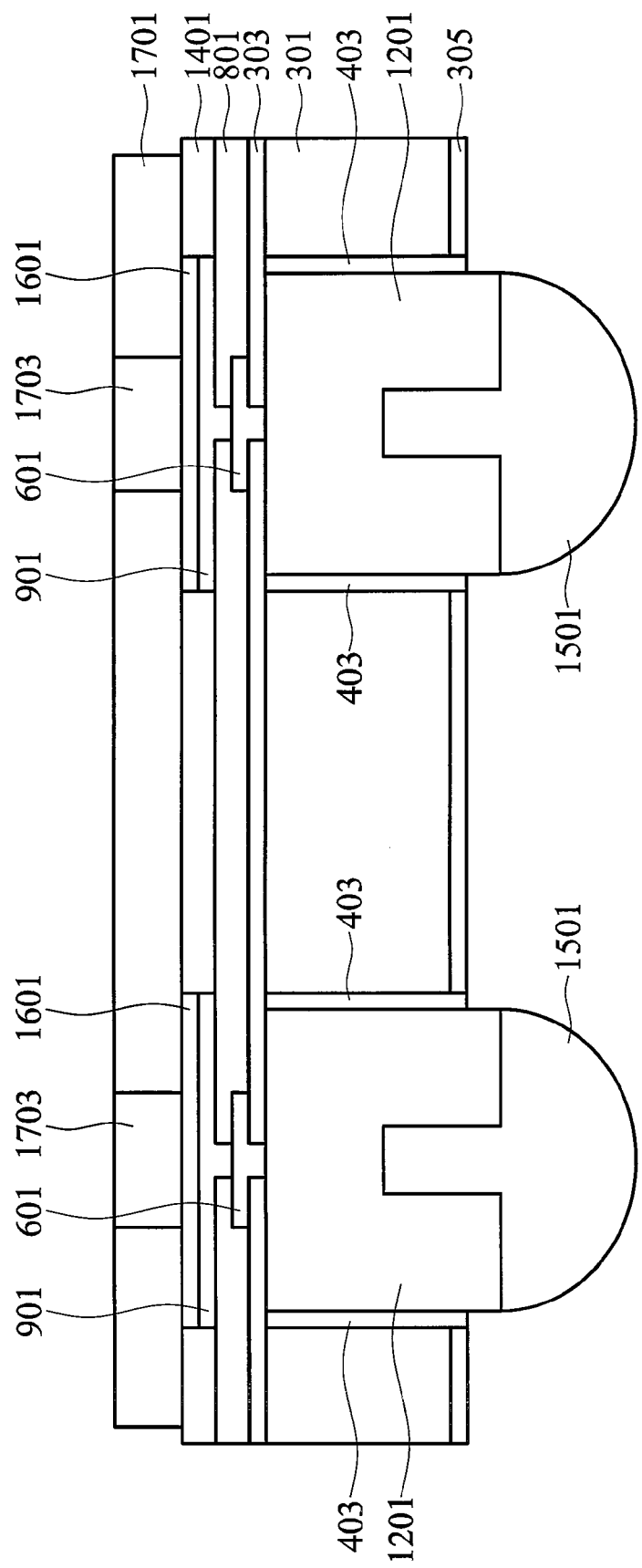

FIG. 17 illustrates the forming and patterning of a first photoresist layer 1701 over the fourth dielectric layer 1401 and the fourth metal layer 1601. The first photoresist layer 1701 preferably has a thickness between about 10 µm and about 100 µm, with a preferred thickness of about 50 µm. The first photoresist layer 1701 may then be patterned to form second openings over the fourth metal layer 1601. The second openings preferably have a width of between about 10 µm and about 100 µm, with a preferred width of about 30 µm.

A fifth metal layer 1703 is then formed within the second openings of the first photoresist layer 1701. The fifth metal layer 1703 is preferably formed of an alloy of nickel and cobalt, although any suitable metal or alloy, such as tungsten or copper, could alternatively be used. In an embodiment in which the fifth metal layer 1703 is a nickel-cobalt alloy, a layer of nickel-cobalt is formed over the first photoresist layer 1701, completely overfilling the second openings of the first photoresist layer 1701 and making electrical contact with exposed portions of the fourth metal layer 1601. The fifth metal layer 1703 may be formed, for example, by electroplating, although other suitable methods could alternatively be used.

Once the openings have been overfilled with the fifth metal layer 1703, the fifth metal layer 1703 is then planarized to be substantially planar with the first photoresist layer 1701. This planarization may be performed through any suitable lapping technique, and is preformed such that portions of the fifth metal layer 1703 not located within the holes are substantially removed from the surface of the first photoresist layer 1701.

Figure 18A:
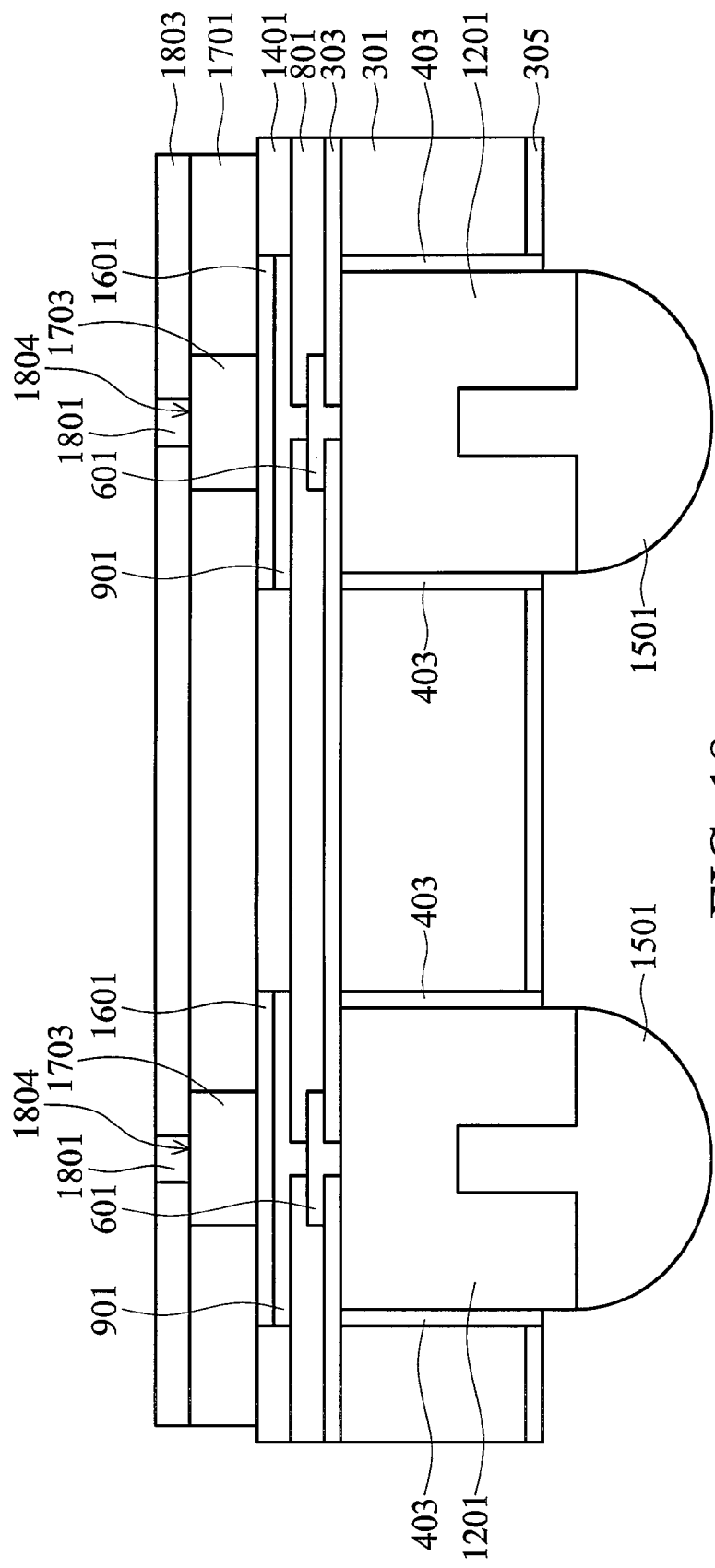
Figure 18B:
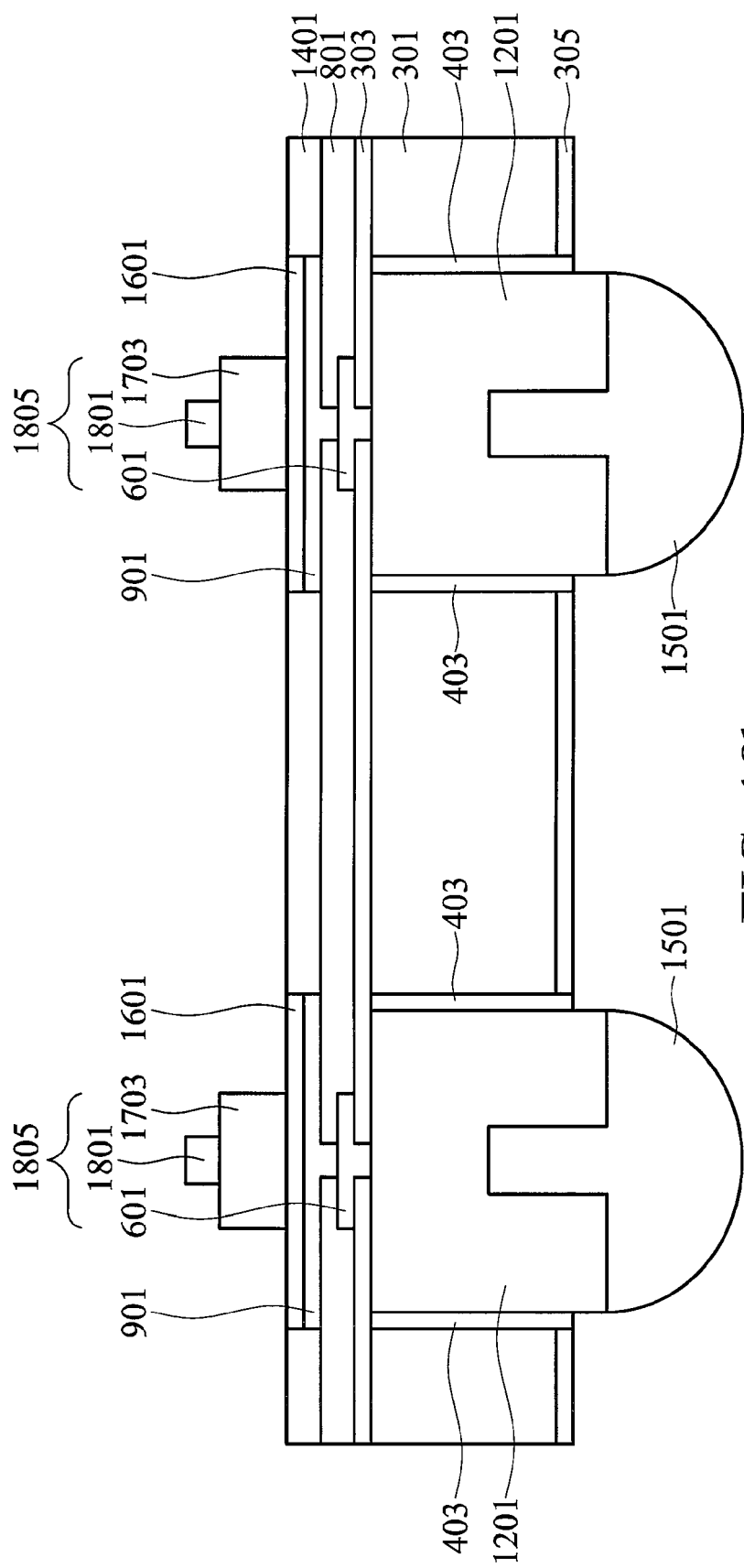
Figure 19A:
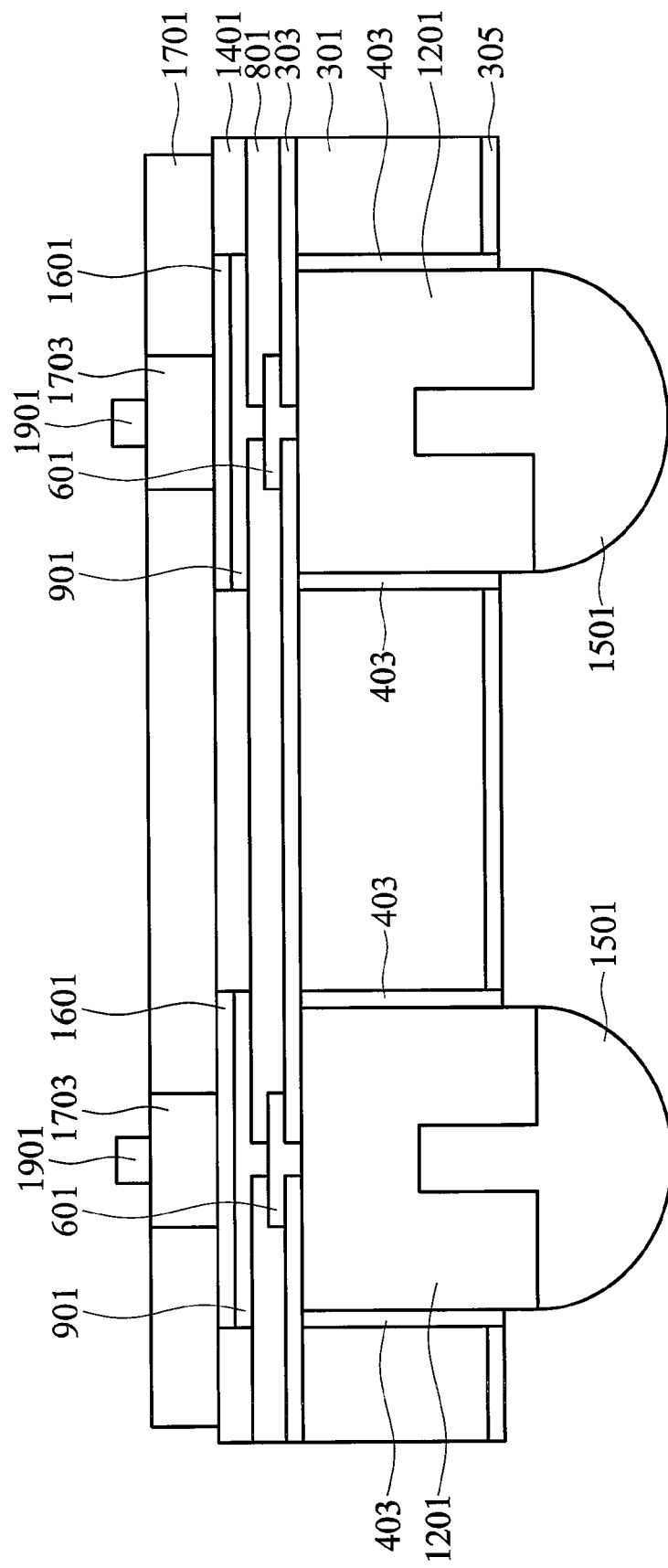
Figure 19B:
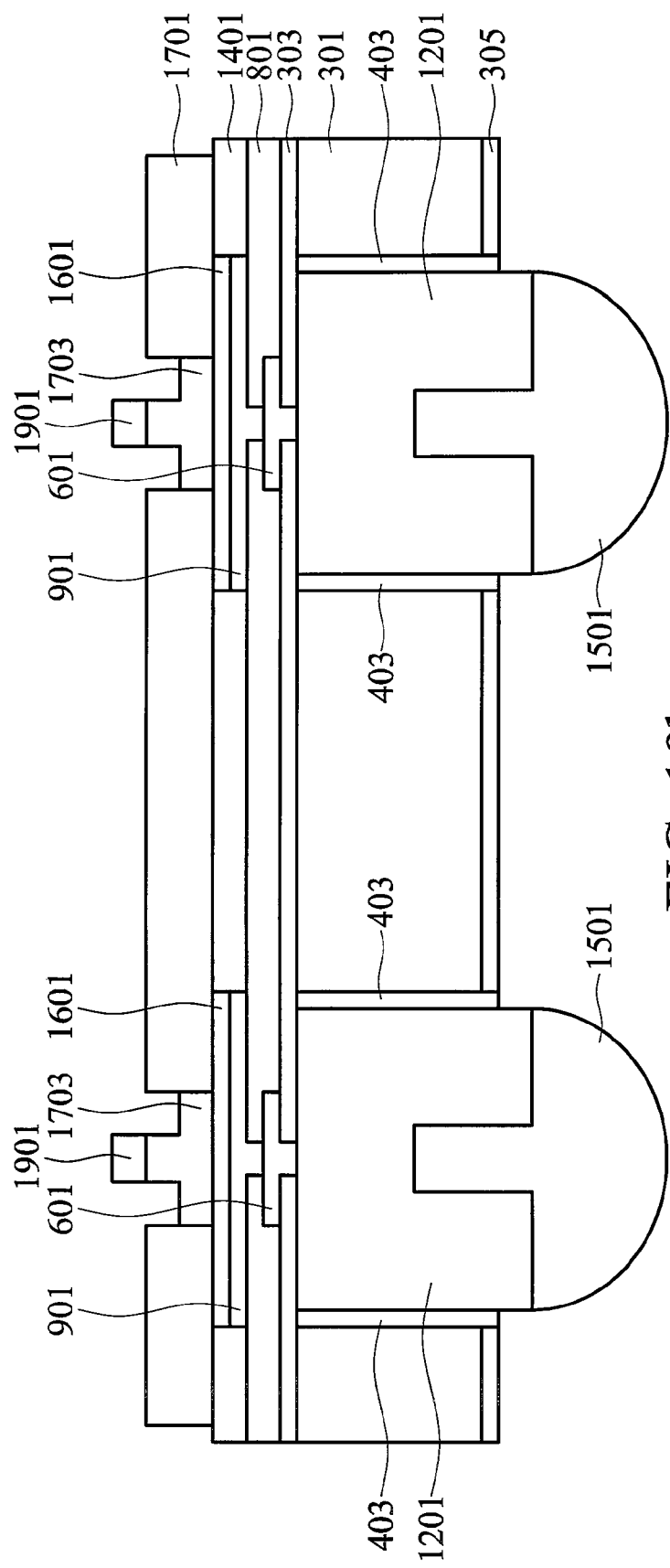

FIGS. 18a-18b and 19a-19c illustrate two different methods of completing the formation of a contact tip 1805 after the formation of the fifth metal layer 1703. FIGS. 18a-18b illustrate a process by which the contact tip 1805 is added to the fifth metal layer 1703. FIGS. 19a-19b illustrate a process by which the actual contact tip 1805 is formed from the already existing fifth metal layer 1703. While each of these processes is discussed separately in the following paragraphs, it should be noted that, outside of these paragraphs, the reference number 1805 is meant to represent either of the tips as illustrated.

As stated, FIGS. 18a-18b illustrate the formation of a contact tip 1805. To form the contact tip 1805, a second photoresist layer 1803 is formed over the first photoresist layer 1701 and the fifth metal layer 1703. The second photoresist layer 1803 is formed to have a thickness of between about 5 µm and about 50 µm, with a preferred thickness of about 10 µm.

The second photoresist layer 1803 is then preferably patterned, using a suitable patterning technique, to form third openings 1804 in the second photoresist layer 1803. The third openings 1804 are formed so as to expose a portion of the fifth metal layer 1703. The third openings 1804 are formed to have a preferred width of between about 5 µm and about 30 µm, with a preferred width of 15 µm.

Once the third openings 1804 have been formed in the second photoresist layer 1803, a sixth metal layer 1801 is formed to substantially fill the third openings 1804 in the second photoresist layer 1803. The sixth metal layer 1801 is formed of a similar material and in a similar fashion as the fifth metal layer 1703, however, other materials and methods could alternatively be used, depending upon process or design requirements.

Optionally, the sixth metal layer 1801 may be plated by a seventh metal layer (not shown). The seventh metal layer preferably comprises rhodium, and is preferably formed through an electroplating process, although other materials, such as gold, and processes could alternatively be used. The seventh metal layer is formed to cap the sixth metal layer in order to increase the hardness of the tip.

FIG. 18b illustrates the resulting structure after the formation of the completed tip 1805. As illustrated, after the formation of the sixth metal layer 1801, the second photoresist layer 1803 and the first photoresist layer 1701 are removed from the structure. This removal leaves behind the completed contact tips 1805. The completed contact tips 1805 preferably have a pitch of about 50 µm.

FIG. 19a illustrates the first step in a second process that could alternatively be used to complete the contact tips 1805. In the process illustrated in FIGS. 19a-19b, a third photoresist layer 1901 is formed over the first photoresist layer 1701 and the fifth metal layer 1703. The third photoresist layer 1901 is then patterned and removed, leaving a remainder to cover and protect a portion of the fifth metal layer 1703. The remaining portion of the first photoresist layer 1701 preferably has a width of between about 5 µm and about 30 µm, with a preferred width of about 15 µm.

FIG. 19b illustrates the removal of an upper portion of the fifth metal layer 1703 to complete the contact tips 1805. The removal may be performed by etching the fifth metal layer 1703 with a suitable etchant, such as $HNO_3$ or $HClO_4$. However, alternative methods and materials could alternatively be used to remove the upper portion of the fifth metal layer 1703. The etching is performed on an upper portion of the fifth metal layer 1703, but is not meant to etch completely to the fourth metal layer 1601. Accordingly, the contact tip 1805 is formed with an upper portion that has a smaller dimension than a bottom portion.

Optionally, the contact tip 1805 could be completed by plating the fifth metal layer 1703 with a seventh metal layer as described above with reference to FIG. 18b. The seventh metal layer is preferably formed in the same fashion and of the same materials as described above.

Figure 19C:
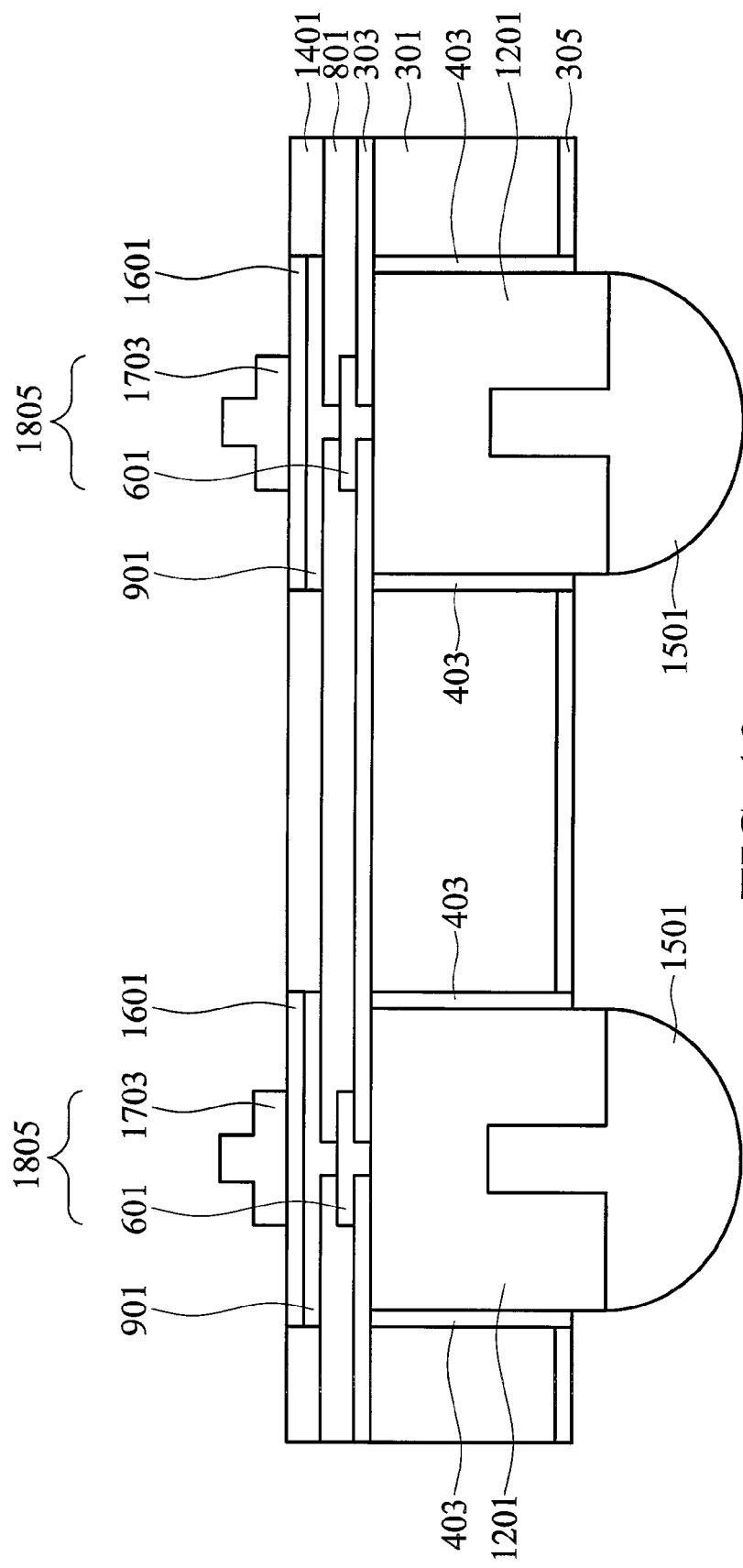

FIG. 19c illustrates the removal of the third photoresist layer 1901 and the first photoresist layer 1701. The removal of the first photoresist layer 1701 and the third photoresist layer 1901 complete the formation of the contact tip 1805.

As one of ordinary skill in the art will realize, while the figures may show the appearance that the contact tips 1805 are located directly over the metal plugs 1201, the contact tips 1805 are actually not located over the metal plugs 1201. Instead, the contact tips 1805 are located away from their respective metal plugs 1201, so as to achieve a smaller pitch than the metal plugs 1201. As described above with respect to the third metal layer 901 in FIG. 13, the third metal layer 901 and the fourth metal layer 1601 are used to connect the contact tips 1805 to their respective metal plugs 1201 and also to fan out the pitch from the contact tips 1805.

Figure 20:
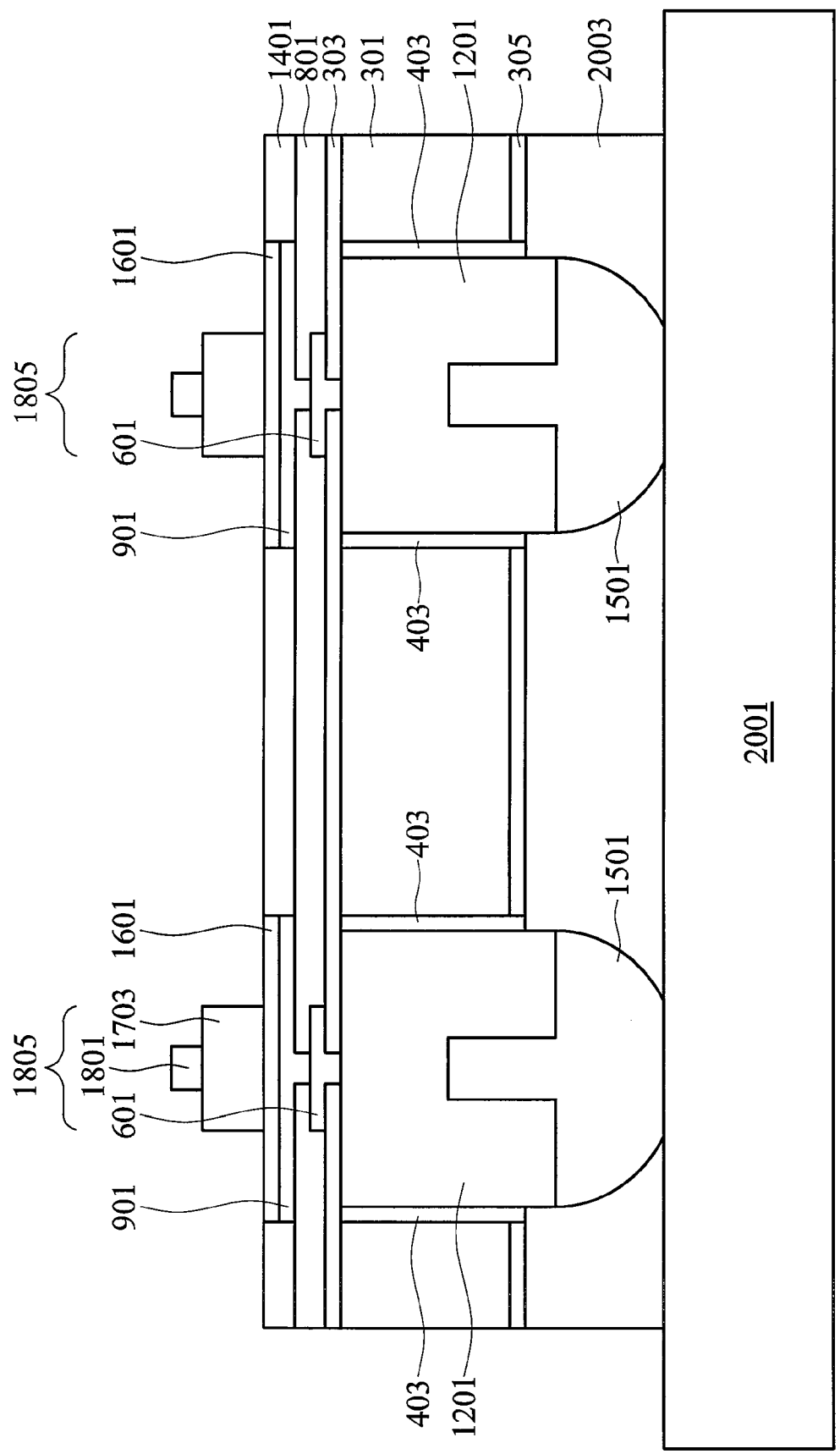

FIG. 20 illustrates the connection of the contact tip 1805 to a larger space transformation layer 2001, through the first connectors 1501. The first connectors 1501 are placed so as to align the first connectors 1501 with contact pads on the space transformation layer 2001. Typically, an underfill material 2003 is injected or otherwise formed in the space between the structure and the space transformation layer 2001. This underfill material 2003 is typically formed in a fluid state and subsequently cured to harden.

The space transformation layer 2001 is preferably formed of a multiple layer ceramic, although other architectures, such as multiple layer organics, could alternatively be used. This multiple layer ceramic comprises alternating layers of conductive and insulative materials (not shown). The routing of the conductive material is designed to accept the pitch of the first connectors 1501 and expand the pitch to another set of contact pads on the opposite side of the space transformation layer 2001.

Figure 21:
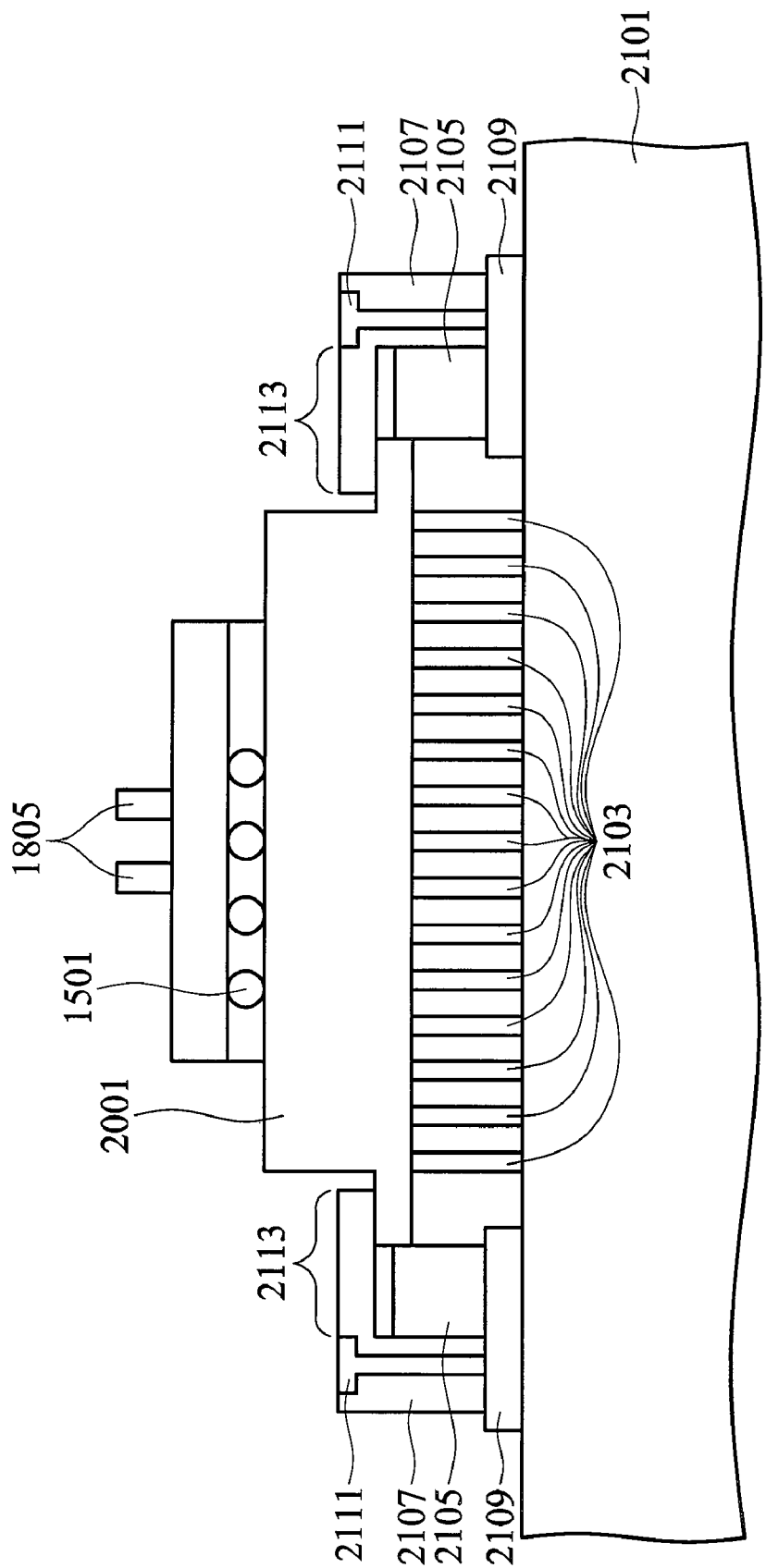

FIG. 21 illustrates an embodiment of the present invention in which a plurality of contacts tips 1805 are electrically connected to a printed circuit board (PCB) 2101 through the space transformation layer 2001. Electrically, the space transformation layer 2001 is connected to the PCB 2101 through a series of second connectors 2103. The second connectors 2103 are spaced at the same pitch as the contact pads of the space transformation layer 2001 (on the opposite side from the first connectors 1501). The second connectors 2103, aside from providing the electrical connections required for the testing of semiconductor devices, may also absorb the probing force from the rigid tips that are used, so that the semiconductor devices to be tested are not damaged during the placement of the structure.

Preferably the second connectors 2103 are pogo pins. These pogo pins provide contacts on each side of the pin and also include a spring so as to absorb some of the impact of contact. A preferred pogo pin includes a cylinder-type barrel, a contact tip at one end of the barrel, a spring connected to a plunger within the barrel, and a second contact tip connected to the plunger.

To ensure proper alignment between the second connectors 2103 and the space transformation layer 2001 a system of high precision smooth fixtures 2105 located on the PCB 2101 are used. In this system a top mounting fixture 2107 is placed over a bottom mounting fixture 2109, and an extension 2113 of the top mounting fixture 2107 extends away from the top mounting fixture 2107 and over at least a portion of the space transformation layer 2001. A smooth fixture 2105 is located between the top mounting fixture 2107 and the space transformation layer 2001, and may be used to ensure that the space transformation layer 1301 can only move perpendicular to the major surface of the PCB 1401.

One such fixture that may be used, for example, is a cylinder. In an embodiment, this cylinder would be connected to the bottom mounting fixture 2109 and would be located under the extension of the top mounting fixture 2107 and between the space transformation layer 2001 and the remaining portion of the top mounting fixture 2107. The cylinder would allow the space transformation layer 2001 to move perpendicular to the major surface of the PCB 2101 to allow the pogo pins to deform and absorb the forces during contact with a test wafer (not shown), but would not allow the space transformation layer 2001 (and the contact tips 1805) to move side-to-side and out of alignment.

As one with ordinary skill in the art will recognize, the space transformation layer 2001 may be aligned with the PCB 2101 in many different ways, and the smooth fixtures 2105 as described above are not meant to limit the present invention. Alternatively, the present invention is also intended to include any other fixtures that can be made with high precision, such as guidance pins, that could be used to limit the movement of the space transformation layer 2001 to the direction that is perpendicular to a major surface of the PCB 2101.

A system of screws 2111 is preferably used to fine tune the planarity of the contact tips 1805. Because the contact tips 1805 have such a small pitch, the planarity of the contact tips 1805 becomes very important, because even a small irregularity in the planarity could cause some of the contact tips 1805 to fail to connect to a required device. Accordingly, a series of screws 2111 may extend through the top mounting fixture 2107 and into the bottom mounting fixture 2109. By adjusting these screws 2111, the planarity of the top mounting fixture 2107, the space transformation layer 2001 (through the extensions 2113), and the contact tips 1805 can be adjusted. In an embodiment, three screws 2111 extend through the top mounting fixture 2107 and into the bottom mounting fixtures 2109, but more or less screws 2111 could alternatively be used. By adjusting these screws 2111, the precise planarity of the contact tips 1805 that is required can be achieved.

Using this invention, the pitch of the tips can be greatly reduced. In testing, the test probing pitch can actually be reduced to less than about 50 μm. Accordingly, semiconductor devices with reduced size can be tested with embodiments of the present invention than would otherwise be able.

Although the present invention and its advantages have been described in detail, it should be understood that various changes, substitutions and alterations can be made herein without departing from the spirit and scope of the invention as defined by the appended claims. For example, there are multiple methods for the deposition of material as the structure is being formed. Any of these deposition methods that achieve substantially the same result as the corresponding embodiments described herein may be utilized according to the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device test structure, the test structure comprising:
    a substrate, the substrate having a first side and a second side, the first side and the second side being on opposing sides of the substrate;
    a plurality of metal plugs with a first pitch located within the substrate, and extending through the substrate from the first side to the second side;
    first electrical connectors electrically connected to the plurality of metal plugs on the first side of the substrate;
    a first dielectric layer located over the substrate and the plurality of metal plugs on the second side of the substrate;
    a first metal layer located over the first dielectric layer, the first metal layer having a first plurality of separate sections, each of the first plurality of separate sections having a portion that extends through the first dielectric layer and being electrically connected to respective ones of the plurality of metal plugs, wherein the portion that extends through the first dielectric layer comprises a material that is solid at an operating temperature of the semiconductor device test structure; and
    a plurality of tips with a second pitch different from the first pitch located over respective ones of the first plurality of separate sections, the plurality of tips having an upper portion and a lower portion, the upper portion being smaller than the lower portion.

2. The semiconductor device test structure of claim 1, wherein the first pitch of the plurality of metal plugs is larger than the second pitch of the plurality of tips.

3. The semiconductor device test structure of claim 1, wherein the second pitch is less than about 50 μm.

4. The semiconductor device test structure of claim 1, wherein the plurality of tips comprises a nickel-cobalt alloy.

5. The semiconductor device test structure of claim 1, further comprising:
    a space transformation layer with a first set of contact pads on a first side of the space transformation layer, the first set of contact pads connected to the respective ones of the first electrical connectors, and a second set of contact pads located on an opposite side of the space transformation layer than the first set of contact pads, the second set of contact pads having a larger pitch than the first set of contact pads; and
    an underfill material formed between the substrate and the space transformation layer.

6. The semiconductor device test structure of claim 5, further comprising:
    a printed circuit board having a third set of contact pads; and
    compressible connectors between the third set of contact pads and the space transformation layer, the compressible connectors electrically connecting the third set of contact pads to respective ones of the second set of contact pads.

7. A semiconductor device test structure, the test structure comprising:
    a printed circuit board with a first set of contact pads;
    a space transformation layer over the printed circuit board, the space transformation layer comprising:
        a second set of contact pads on a first surface of the space transformation layer facing the printed circuit board;

a third set of contact pads on a second surface of the space transformation layer opposite the printed circuit board, the third set of contact pads having a first pitch; and conductive lines electrically connecting the second set of contact pads and the third set of contact pads;

a first plurality of connectors between the first set of contact pads and the second set of contact pads, the first plurality of connectors being arranged to have a second pitch that is larger than the first pitch;

a substrate located over the space transformation layer;

a plurality of metal plugs located within the substrate, and extending through the entire substrate;

a second plurality of connectors electrically connected to the metal plugs on one side of the substrate, and also electrically connected to the third set of contact pads;

a plurality of tips electrically connected to respective ones of the plurality of metal plugs and having a third pitch, the third pitch being smaller than the first pitch, the plurality of tips having an upper portion and a lower portion, the upper portion being smaller than the lower portion, the upper portion having a uniform width and extending away from the metal plugs at a right angle; and one or more metal layers located between the plurality of tips and the plurality of metal plugs, the one or more metal layers electrically connecting the plurality of tips to respective ones of the plurality of metal plugs.

8. The semiconductor device test structure of claim 7, further comprising a metal cap overlying each of the plurality of tips.

9. The semiconductor device test structure of claim 7, wherein the plurality of tips comprises a nickel-cobalt alloy.

10. The semiconductor device test structure of claim 7, wherein the first plurality of connectors comprise pogo pins.

11. The semiconductor device test structure of claim 7, further comprising:

a bottom mounting fixture located on the printed circuit board;

a top mounting fixture located over the bottom mounting fixture, the top mounting fixture having an extension that extends over at least a portion of the space transformation layer; and a plurality of screws connecting the top mounting fixture to the bottom mounting fixture.

12. The semiconductor device test structure of claim 7, further comprising a guidance mechanism arranged so as to ensure the proper alignment of the first plurality of electrical connections.

13. A semiconductor device test structure, the test structure comprising:

a printed circuit board with a first plurality of contact pads;

a space transformation layer over the circuit board, wherein the space transformation layer has a second plurality of contact pads on a first major surface of the space transformation layer facing the printed circuit board, and a third plurality of contact pads on a second major surface of the space transformation layer facing away from the printed circuit board, each contact pad of the third plurality of contact pads being electrically connected to one of the contact pads of the second plurality of contact pads, wherein the second plurality of contact pads has a first pitch and the third plurality of contact pads has a second pitch that is smaller than the first pitch;

a first plurality of electrical connections connecting the first plurality of contact pads and the second plurality of contact pads;

a substrate over the space transformation layer;

a plurality of metal plugs extending through the substrate;

a second plurality of electrical connections between respective ones of the plurality of metal plugs and the third plurality of contact pads;

a first dielectric layer on an opposing side of the substrate from the second plurality of electrical connections; and a plurality of tips over the first dielectric layer and electrically connected to respective ones of the plurality of metal plugs through one or more metal layers, the plurality of tips having a third pitch that is smaller than the second pitch and having an upper portion that is smaller than a lower portion;

wherein the one or more metal layers extend through the first dielectric layer with a uniform width.

14. The semiconductor device test structure of claim 13, further comprising a metal cap over each of the plurality of tips.

15. The semiconductor device test structure of claim 13, wherein the plurality of tips comprises a nickel-cobalt alloy.

16. The semiconductor device test structure of claim 13, wherein the first plurality of connectors comprises pogo pins.

17. The semiconductor device test structure of claim 13, wherein the third pitch is less than about 50 μm.

18. The semiconductor device test structure of claim 13, further comprising a plurality of screws extending through a top mounting fixture and to a bottom mounting fixture, the bottom mounting fixture being connected to the printed circuit board, and the top mounting fixture having a portion that extends over at least a portion of the space transformation layer.

19. The semiconductor device test structure of claim 13, wherein the one or more metal layers comprises three metal layers.

20. The semiconductor device test structure of claim 13, further comprising guides to position the space transformation layer relative to the printed circuit board, the guides further limiting movement of the space transformation layer relative to the printed circuit board to a direction substantially normal to a major surface of the printed circuit board.

* * * * *